United States Patent [19]

Yockey

[11] Patent Number: 5,043,614

[45] Date of Patent: Aug. 27, 1991

[54] ALTERNATOR RECTIFIER BRIDGE ASSEMBLY

[75] Inventor: Steve J. Yockey, Farmington Hills, Mich.

[73] Assignee: Ford Motor Company, Dearborn, Mich.

[21] Appl. No.: 473,798

[22] Filed: Feb. 2, 1990

[51] Int. Cl.⁵ .................. H09K 11/00; H02B 1/00; H02M 1/10

[52] U.S. Cl. ................ 310/68 D; 363/144; 363/145; 361/388

[58] Field of Search .......... 310/68 D, 68 R; 363/126, 144, 145; 361/383, 386, 388

[56] References Cited

U.S. PATENT DOCUMENTS

| | | |
|---|---|---|
| 3,001,121 | 9/1961 | Kerr, Jr. |
| 3,041,484 | 6/1962 | Freer et al. |
| 3,184,625 | 5/1965 | Farison .................. 310/59 |
| 3,295,046 | 12/1966 | Margaira .............. 310/68 D |
| 3,422,339 | 1/1969 | Baker .................... 310/68 D |
| 3,527,971 | 9/1970 | Means .................. 310/68 D |
| 3,539,850 | 11/1970 | Sato ........................ 310/68 |
| 3,629,630 | 12/1971 | Cotton .................. 310/68 D |
| 3,925,809 | 12/1975 | Striker ...................... 357/81 |
| 3,959,676 | 5/1976 | Striker .................. 310/68 D |
| 4,189,653 | 2/1980 | Hiratuka et al. ..... 310/68 D |
| 4,218,694 | 8/1980 | Grzybowski ............ 357/76 |
| 4,284,914 | 8/1981 | Hagenlocher et al. ...... 310/68 D |
| 4,284,915 | 8/1981 | Hagenlocher et al. ...... 310/68 D |
| 4,286,186 | 8/1981 | Hagenlocher et al. ...... 310/68 D |
| 4,288,711 | 9/1981 | Hagenlocher et al. ...... 310/68 D |
| 4,307,437 | 12/1981 | Severing .................. 361/386 |
| 4,321,664 | 3/1982 | Matthai .................... 363/141 |
| 4,419,597 | 12/1983 | Shiga et al. ........... 310/68 D |
| 4,538,169 | 8/1985 | Smith et al. .............. 357/76 |
| 4,799,309 | 1/1989 | Cinzori et al. ............ 29/596 |
| 4,835,427 | 5/1989 | Böhm et al. ............ 310/68 D |

FOREIGN PATENT DOCUMENTS

| | | | |
|---|---|---|---|
| 2349825 | 4/1974 | Fed. Rep. of Germany ... | 310/68 D |
| 2845663 | 5/1980 | Fed. Rep. of Germany ... | 310/68 D |
| 2361007 | 3/1978 | France . | |
| 0004303 | 1/1979 | Japan ............................ | 310/68 R |

Primary Examiner—Steven L. Stephan
Assistant Examiner—C. LaBalle
Attorney, Agent, or Firm—Paul K. Godwin, Jr.; Roger L. May

[57] ABSTRACT

An alternator rectifier bridge is incorporated into an alternator housing by inserting half of the diodes of the bridge into apertures formed into an alternator housing end plate which then serves as one output for the alternator and also as a massive heat sink to dissipate heat generated in the diodes. The other half of the diodes of the bridge are inserting into apertures formed in a radiator plate which is embedded into a plastic circuit member together with conductor members which interconnect electrodes of the diodes to stator windings of the alternator and also perform other electrical connections required for efficient manufacture and proper operation of the alternator. The radiator plate serves as the other output for the alternator and also as a heat sink. The plastic circuit member is coupled to the alternator housing end plate such that the electrodes of the diodes embedded therein pass through the plastic circuit member to engage corresponding ones of the conductor members resulting in a compact, highly efficient bridge which is readily assembled, preferably in an automated manner, using a limited number of component parts.

19 Claims, 4 Drawing Sheets

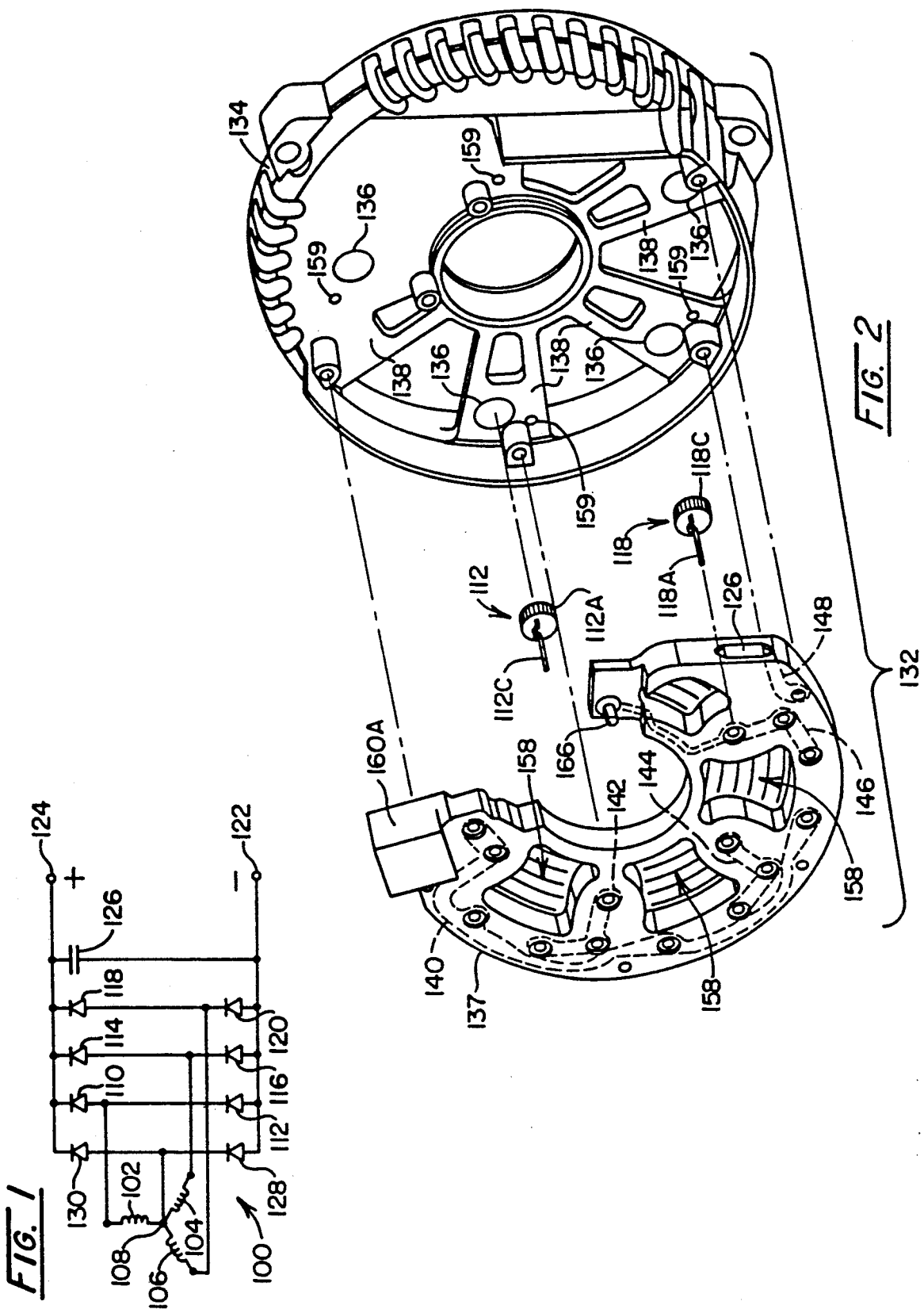

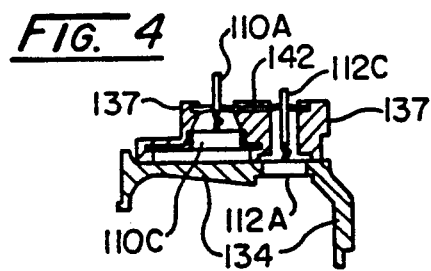
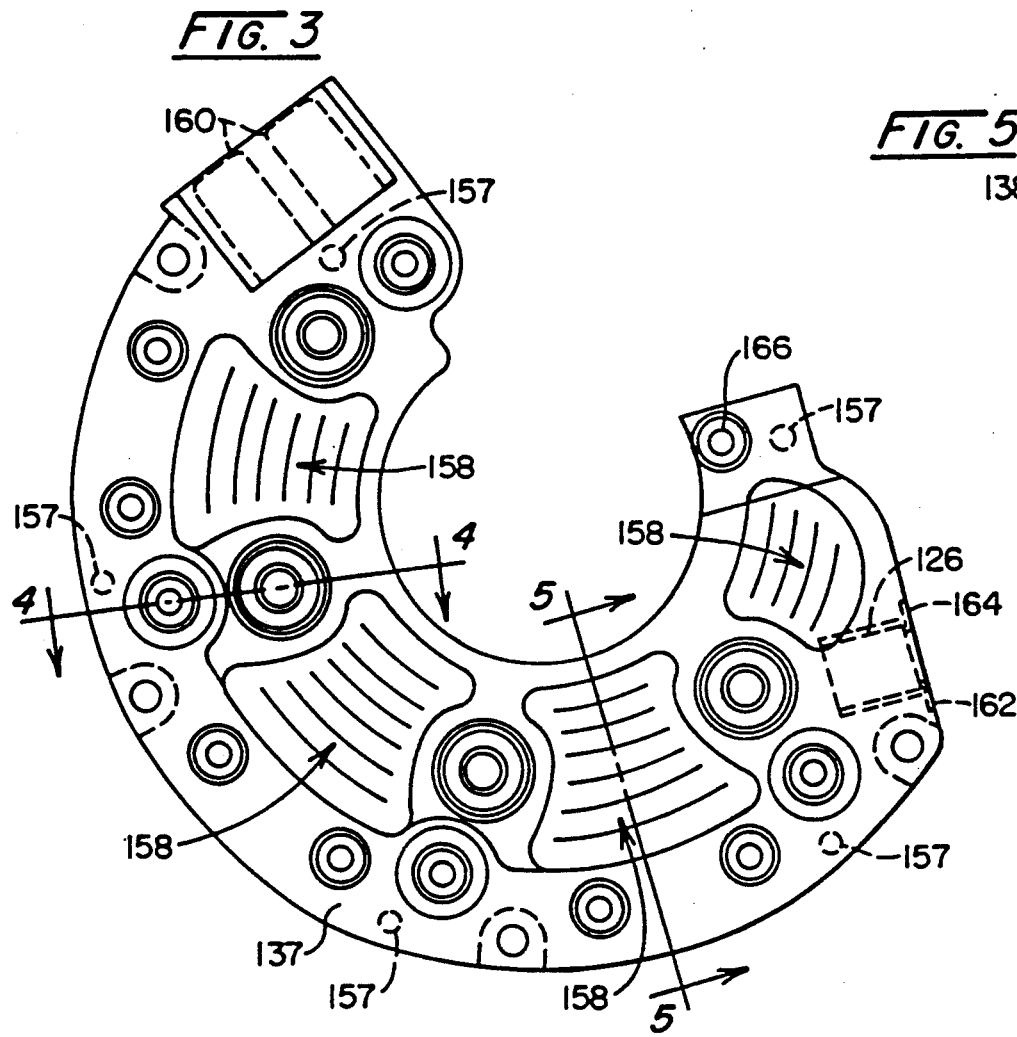
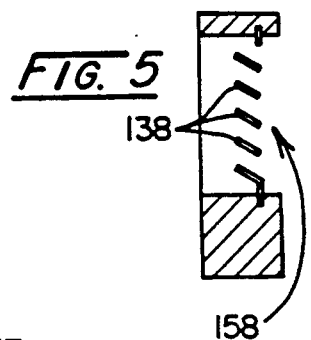
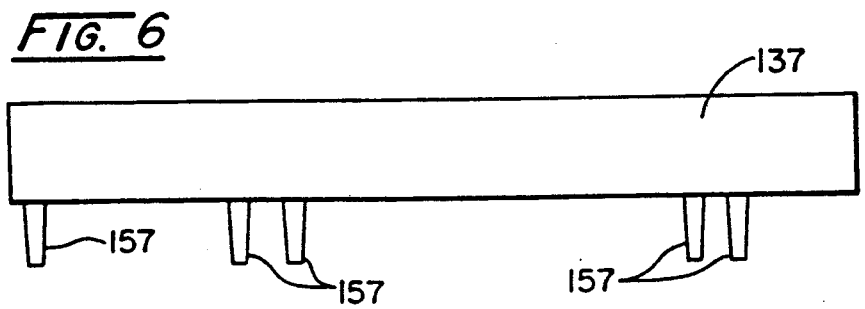

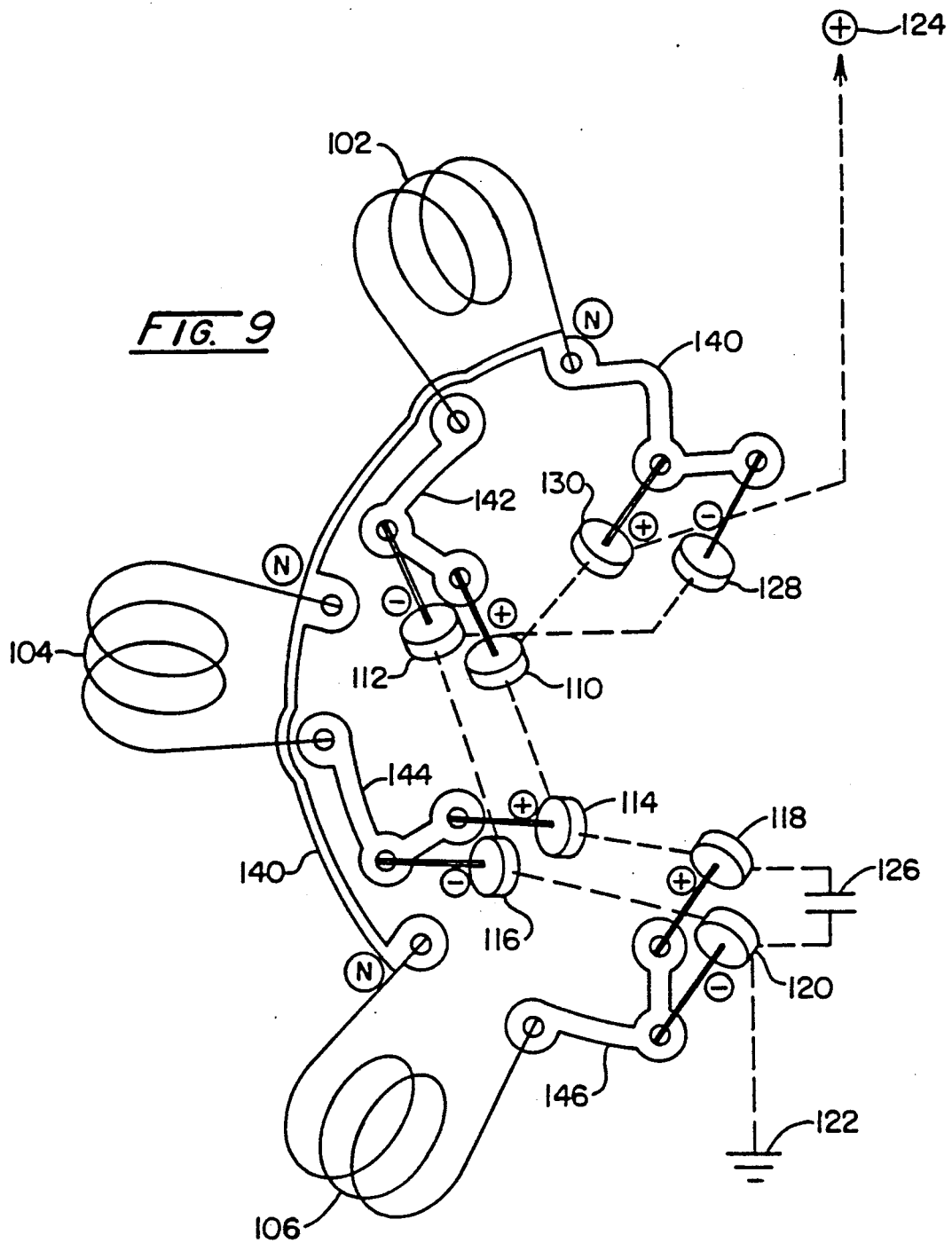

ALTERNATOR RECTIFIER BRIDGE ASSEMBLY

BACKGROUND OF THE INVENTION

The present invention relates generally to the field of alternators as used, for example, to supply DC electrical power to motor vehicles and, more particularly, to an improved alternator rectifier bridge assembly provided within an alternator housing and a method of making the bridge assembly A three phase alternator rectifier bridge, such as used in a motor vehicle alternator, comprises three "negative" diodes having their anodes connected to a ground terminal and three "positive" diodes having their cathodes connected to a voltage output terminal. Each of the cathodes of the negative diodes are connected to one of the anodes of the three positive diodes and to one of three stator windings of an alternator. In the interest of conserving space and facilitating the manufacture and repair of alternators, the diodes used to form rectifier bridge circuits have been packaged together as a unit which preferably is mounted within the housing of the alternator. For example, U.S. Pat. No. 3,184,625 describes a technique for mounting diodes on metal plates within the housing of an alternator. The metal plates are shown to provide electrical interconnection to common terminals for each set of diodes. However, numerous wire-to-wire solder connections are required to interconnect the diodes in the rectifier unit.

Such compact packaging also creates a problem commonly addressed in known prior art rectifier bridge circuits, i.e. the dissipation of heat which is generated by the conduction of substantial currents through the diodes of the bridge circuits. U.S. Pat. Nos. 3,539,850, 3,925,809, 3,959,676, 4,218,694, 4,307,437, 4,321,664, 4,538,169, 4,799,309 and 4,835,427 all show various techniques for packaging diodes in a manner that will facilitate heat dissipation. In particular, U.S. Pat. No. 3,959,676 describes sandwiching the diodes between a pair of heat sinking DC terminal plate members and a generally U-shaped circuit board member comprised of conductive strips embedded within and insulated by a plastic material The resulting unitary composite body is mounted within the housing end plate of an alternator. U.S. Pat. No. 4,538,169 describes another sandwiched diode structure wherein a base is mounted on the alternator housing case to transfer heat directly thereto.

While the known rectifier bridge circuit arrangements perform satisfactory heat transfer/dissipation, further improvements in heat transfer/dissipation and simplification of the structure of bridge circuit arrangements are always in demand to further the state of the art and, more importantly in view of the competitive nature of the motor vehicle industry, to provide lower costs through simplified assembly with parts which are less expensive and fewer in number.

SUMMARY OF THE INVENTION

The state of the art is advanced by the method and apparatus of the present invention which define an alternator rectifier bridge by incorporation into an alternator housing. Half of the diodes of the rectifier bridge are inserted into apertures formed into an alternator housing end plate such that the end plate serves as one output for the alternator and also as a massive heat sink to dissipate heat generated in the diodes. Typically, the diodes inserted into the end plate are negative diodes with their anode electrodes being inserted and their cathode electrodes extending beyond the end plate. The other half of the diodes of the rectifier bridge are inserted into apertures formed in a radiator plate. Typically, the diodes inserted into the radiator plate are positive diodes with their cathode electrodes being inserted and their anode electrodes extending beyond the radiator plate. The radiator plate is embedded into a plastic circuit member together with conductor members which serve to interconnect electrodes of the diodes to stator windings of the alternator. The conductor members also provide other electrical connections required for efficient manufacture and proper operation of the alternator.

The radiator plate serves as the other output for the alternator and also as a heat sink having enhanced heat dissipation abilities due to the inclusion of louvers formed into the plate adjacent the diode receiving apertures. The anode terminals of the positive diodes extending beyond the radiator plate are received by corresponding ones of the conductor members. The plastic circuit member is coupled to the alternator housing end plate such that the cathode electrodes of the negative diodes pass through the plastic circuit member and beyond the radiator plate to also engage corresponding ones of the conductor members. Thus, the present invention results in a compact, highly efficient bridge which is readily assembled, preferably in an automated manner, using a limited number of component parts.

In accordance with one aspect of the present invention, a poly-phase alternator rectifier bridge assembly comprises a plurality of positive diodes, each positive diode having an anode electrode and a cathode electrode and a plurality of negative diodes, each negative diode having an anode electrode and a cathode electrode. A generally crescent-shaped positive radiator plate is provided to receive the cathode electrodes of the positive diodes in a plurality of apertures formed therein. The anode electrodes of the positive diodes extend beyond the positive radiator plate. The apertures are formed on radially extending portions of the positive radiator plate. The radially extending portions of the plate include passage means which permit the cathode electrodes of the negative diodes to extend beyond the positive radiator plate in the same direction as the anode electrodes of the positive diodes. The radially extending portions are separated from one another by airflow means for passing cooling air through the positive radiator plate. The radially extending portions also serve to pair individual ones of the positive diodes with individual ones of the negative diodes for connection of the resulting diode pairs with stator windings of an alternator. Housing means for enclosing one end of the alternator includes apertures formed to receive the anode electrodes of the negative diodes with the cathode electrodes of the negative diodes extending outwardly therefrom. The housing means is formed to receive the positive radiator plate such that the extending cathode electrodes of the negative diodes extend into the passage means. First electrical circuit means interconnect the extending anode/cathode electrodes of the pairs of diodes to the stator windings of the alternator. The positive radiator plate and the first electrical circuit means are embedded into a molded plastic insulator to electrically insulate them from one another and from the housing means.

In accordance with another aspect of the present invention, a poly-phase alternator rectifier bridge assembly is incorporated into an alternator housing end plate and comprises an even plurality of diodes each having an anode electrode and a cathode electrode. The diodes are arranged in diode pairs wherein the anode electrode of one diode of the pair is connected to the cathode electrode of the other diode of the pair and to a stator winding of an alternator. A plurality of apertures are formed into radially extending arms of the alternator housing end plate for receiving a first half of the diodes. A plastic circuit member, adapted to be secured to the end plate, has a generally crescent-shaped radiator plate and a plurality of conductor members embedded therein and electrically insulated from one another thereby. The radiator plate has apertures formed in radially extending portions thereof for receiving a second half of the diodes. The radially extending portions are aligned with the arms and are separated from one another by airflow means for passing cooling air through the positive radiator plate. The conductor members connect anode/cathode electrodes of the pairs of diodes to stator windings of the alternator after the plastic circuit member is secured to the alternator housing end plate. The radiator plate defines a first output of the alternator and the alternator housing end plate defines a second output of the alternator.

In accordance with still another aspect of the present invention, a poly-phase alternator rectifier bridge assembly is incorporated into an alternator housing and comprises an alternator housing end plate having a plurality of apertures formed into radially extending arms thereof. A plurality of diodes are inserted into the apertures of the end plate. A plastic circuit member has a generally crescent shaped radiator plate and a plurality of conductor members embedded therein and electrically insulated from one another by the plastic of the circuit member. The radiator plate has apertures formed in radially extending portions thereof which are aligned with the arms and separated from one another by airflow means for passing cooling air through the radiator plate. A plurality of diodes are inserted into the apertures of the radiator plate. Means are provided for securing the plastic circuit member to the alternator housing end plate. The conductor members connect anode/cathode electrodes of pairs of diodes associated with the arms to stator windings of the alternator after the plastic circuit member is secured to the alternator housing end plate. The radiator plate defines a first output of the alternator and the alternator housing end plate defines a second output of the alternator.

In accordance with yet another aspect of the present invention, a rectifier bridge assembly for a poly-phase alternator having a plurality of stator windings comprises an alternator housing end plate having radially extending arms including a plurality of apertures formed into the arms for receiving a like plurality of diodes. A generally crescent shaped plastic circuit member is formed to be received by and secured to the end plate. The plastic circuit member has an electrically conductive radiator plate and a plurality of conductor members embedded therein and electrically insulated from one another by the plastic of the circuit member. The radiator plate has a plurality of apertures formed in radially extending portions thereof for receiving a like plurality of diodes. The radially extending portions of the plate are generally aligned with the arms when the plastic circuit member is secured to the end plate and are separated from one another by airflow means for passing cooling air through the radiator plate. A plurality of diodes each having a first electrode and opposite second electrode are provided, the apertures of the alternator end plate all receiving like electrodes and the apertures of the radiator plate all receiving like opposite electrodes; and Means are provided for securing the plastic circuit to the alternator housing end plate. The conductor members electrically connect first/second electrodes of pairs of diodes associated with to stator windings of the alternator after the plastic circuit member is secured to the alternator housing end plate. The radiator plate defines a first output of the alternator and the alternator housing end plate defines a second output of the alternator.

The airflow means preferably comprises louvers formed into the positive radiator plate between its radially extending portions. While a variety of fasteners can be used, the means for securing the plastic circuit member to the alternator housing end plate preferably comprises plastic extensions of the plastic circuit member which are inserted through corresponding opening in the end plate and heat staked thereto Advantageously, the radiator plate defines terminal means for connection to the first output of the alternator and preferably comprises at least one spade terminal. In addition, at least one of the plurality of conductor members can define terminal means for connection to the conductor member.

In accordance with an additional aspect of the present invention, a method for making a rectifier bridge assembly for a poly-phase alternator having a plurality of stator windings comprises the steps of: providing an alternator housing end plate having radially extending arms; forming a plurality of apertures into the arms for receiving a like plurality of diodes; inserting a first plurality of diodes having anode electrodes and cathode electrodes into the apertures of the housing end plate with like electrodes extending from the end plate; forming a generally crescent-shaped plastic circuit member to be received by and secured to the end plate, the plastic circuit member having an electrically conductive radiator plate defining a plurality of apertures in radially extending portions thereof for receiving a like plurality of diodes, the radially extending portions being generally aligned with the arms when the plastic circuit member is secured to the end plate and being separated from one another by airflow means, and a plurality of conductor members embedded therein and electrically insulated from one another thereby; inserting diodes having anode/cathode electrodes into the apertures of the radiator plate with like electrodes extending from the radiator plate and being received by the conductor means; and, coupling the plastic circuit member to the end plate such that like electrodes of the diodes inserted into the apertures of the end plate are received by the conductor means The step of forming generally crescent shaped plastic circuit member may comprise the steps of: supporting the electrically conductive radiator plate in a plastic mold; supporting the plurality of conductor members in the plastic mold; and, inserting plastic into the plastic mold. Preferably, the step of forming a generally crescent-shaped plastic circuit member comprises the steps of: supporting the electrically conductive radiator plate in a plastic mold; providing the plurality of conductor members as an integral unit wherein the plurality of conductor members are interconnected by severable bridges; supporting the integral unit in the plastic mold;

inserting plastic into the plastic mold; removing the contents of the plastic mold; and, severing the bridges.

Other features and advantages of the invention will be apparent from the following description, the accompanying drawings and the appended claims. dr

BRIEF DESCRIPTION OF THE DRAWINGS

FIG. 1 is an electrical schematic diagram of an alternator rectifier bridge;

FIG. 2 is an exploded perspective view of an alternator rectifier bridge in accordance with the present invention;

FIG. 3 is a plan view of a plastic circuit member for use in the present invention;

FIG. 4 is a sectional view showing a diode pair assembled in accordance with the present invention taken along the section line 4—4 of FIG. 3;

FIG. 5 ia a sectional view showing the cooling louvers of the present invention taken along the section line 5—5 of FIG. 3;

FIG. 6 is a front view of the plastic circuit member of FIG. 3 showing plastic extensions which are used to secure the circuit member to an alternator housing end plate;

FIG. 9 is a perspective/schematic view of the diode/stator electrical interconnections performed by the rectifier bridge of the present invention.

DETAILED DESCRIPTION OF THE INVENTION

Figure 7:
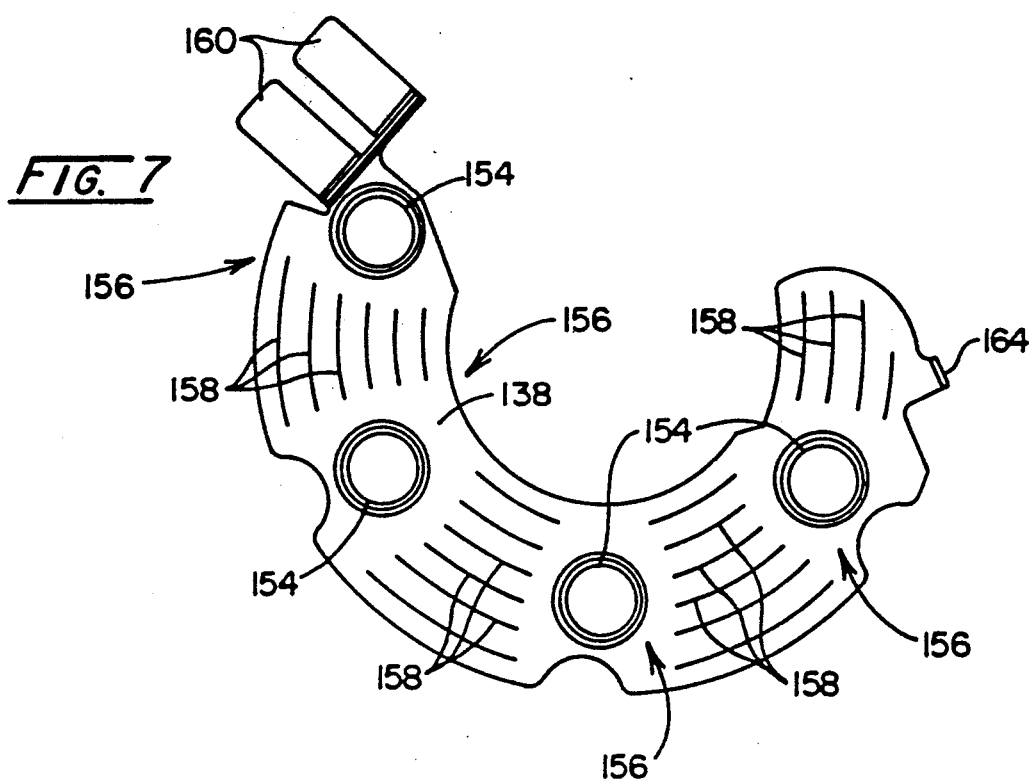
FIG. 7 is plan view of a radiator plate used in the present invention.

Referring to FIG. 1, a typical alternator bridge circuit 100 is connected to stator windings 102, 104, 106 of an alternator. The bridge circuit 100 may be used with any type of alternator but is particularly applicable to alternators used for electrical power systems in motor vehicles. Typically, motor vehicle alternators include aluminum housings and are position adjacent the vehicle's engine in the engine compartment.

The stator windings 102, 104, 106 are interconnected at a neutral node 108 into a wye configuration. The other end of winding 102 is connected to the anode electrode of a diode 110 and the cathode electrode of a diode 112. The other end of winding 104 is connected to the anode electrode of a diode 114 and the cathode electrode of a diode 116. The other end of winding 106 is connected to the anode electrode of a diode 118 and the cathode electrode of a diode 120. The diodes 112, 116 and 120 have their anode electrodes connected to a negative output terminal 122 and are usually referred to as "negative" diodes. The diodes 110, 114 and 118 have their cathode electrodes connected to a positive output terminal 124 and are usually referred to as "positive" diodes. The negative output terminal 122 is at a lower voltage than the positive output terminal 124 and is typically connected to the alternator housing which is at around potential.

Oftentimes, a capacitor 126 is coupled between the output terminals 122, 124 for noise suppression, for example to prevent interference with the reception of a radio within a motor vehicle. An additional pair of diodes 128, 130 having their cathode electrode and anode electrode, respectively, connected to the neutral node 108 and their anode electrode and cathode electrode, respectively, connected to output terminals 122, 124 may be included for additional current output at high operating speeds.

Referring now to FIG. 2, the rectifier bridge assembly 132 of the present invention embodying the circuit 100 is shown in exploded perspective view. The bridge assembly 132 comprises a plurality of positive diodes 110, 114, 118, 130, only one of which is shown in FIG. 2, with each positive diode having first electrode, such as an anode electrode, and an opposite second electrode, such as a cathode electrode; and A plurality of negative diodes 112, 116, 120, 128, is also included again with only one being shown in FIG. 2, with each negative diode having a first electrode, such as an anode electrode, and an opposite second electrode, such as a cathode electrode.

Housing means for enclosing one end of an alternator comprises an alternator housing end plate 134 in the illustrated embodiment of the present invention. The end plate 134 includes apertures 136 formed into radially extending arms 138 to receive the anode electrodes, represented by electrode 112A in FIG. 2, of the negative diodes 112, 116, 120, 128 with the cathode electrodes, represented by electrode 112C in FIG. 2, of the negative diodes 112, 116, 120, 128 extending outwardly from the end plate 134. One of the arms 138 is substantially wider than the others to ensure proper flow of cooling air through openings between the arms 138.

Figure 8:
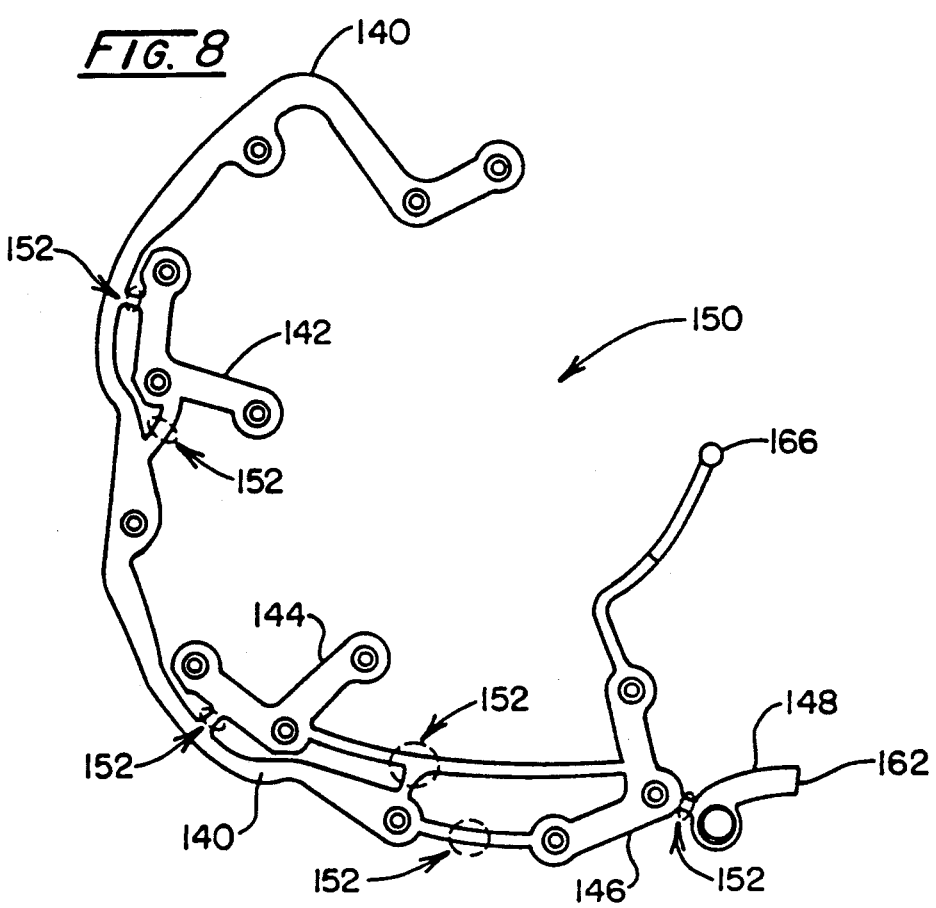
FIG. 8 is a plan view of an integral assembly of conductor members utilized in the preferred method of making an alternator rectifier bridge in accordance with the present invention.

A plastic circuit member 137 adapted to be secured to the end plate 134, a generally crescent-shaped radiator plate 139, best shown in FIG. 7, and first electrical circuit means comprising a plurality of conductor members 140, 142, 144, 146, 148, best shown in FIGS. 2 and 8, embedded therein and electrically insulated from one another by the plastic of the plastic circuit member 137. The conductor members 140, 142, 144, 146, 148 are shown as being interconnected into an integral unit 150 by bridge members 152 which are ultimately severed in accordance with the preferred method of making the bridge assembly 132 of the present invention as will be described.

The radiator plate 139 has apertures 154 formed in radially extending portions 156 thereof for receiving the cathode electrodes, represented by the cathode electrode 118C in FIG. 2, of the positive diodes 110, 114, 118, 130 with the anode electrodes, represented by the anode electrode 118A, extending beyond the radiator plate 139. The radially extending portions 156 are generally aligned with the arms 138 when the plastic circuit member 137 is secured to the end plate 134 and include passage means comprising semicircular indentations 156A for passing cathode electrodes, represented by the cathode electrode 112C in FIG. 2, of the negative diodes 112, 116, 120, 128. While a variety of devices including rivets and the used to secure the plastic circuit member 137 to the end plate 134, preferably the plastic circuit member 137 includes plastic extensions 157 which are extended through corresponding openings 159 and heat staked, see FIGS. 6 and 2. The radially extending portions 156 are also separated from one another by airflow means comprising louvers 158 in the illustrated embodiment for passing cooling air through the positive radiator plate 139, see FIG. 5.

The conductor members 140, 142, 144, 146 connect anode/cathode electrodes of pairs of the diodes 110, 112; 114, 116; 118, 120; 128, 130 to the stator windings 102, 104, 106 of the alternator after the plastic circuit member 137 is secured to the alternator housing end plate 134. While the electrical interconnections are apparent from a review of several of the drawing figures, they are most readily apparent from the perspective/schematic view of FIG. 9.

The radiator plate 139 defines a first output of the alternator corresponding to the positive output terminal 124 and the alternator housing end plate 134 defines a second output of the alternator corresponding to the negative output terminal 122. To this end, the radiator plate 139 defines terminal means comprising the spade terminals 160 for convenient electrical connection thereto. Similarly, at least one of the conductor members 140, 142, 144, 146, 148 defines terminal means for connection thereto. In the illustrative embodiment, an electrical connection pad 162 permits incorporation of the noise suppression capacitor 126 into the plastic circuit member 137. As best shown in FIG. 3, the capacitor 126 is interconnected between the pad 162 on the conductor member 148 and an electrical connection pad 164 formed on the radiator plate 139. The conductor member 146 is also extended to form or connect to a terminal pin 166 which can conveniently be utilized to connect the bridge circuit 100 to a stator sense lead of a voltage regulator (not shown) which is associated with the plastic circuit member 137 and also secured to the end plate 134.

While the present invention should be apparent from the foregoing description, a method for making the rectifier bridge assembly 100 for a poly-phase alternator having a plurality of stator windings 102, 104, 106 will now be described. The method comprises the steps of: providing the alternator housing end plate 134 having radially extending arms 138; forming a plurality of apertures 136 into the arms 138 for receiving a like plurality of diodes; inserting a first plurality of diodes 112, 116, 120, 128 having anode electrodes 112A and cathode electrodes 112C into the apertures 136 of the housing end plate 134 with like electrodes (cathode electrodes illustrated) extending from the end plate 134; forming a generally crescent-shaped plastic circuit member 137 to be received by and secured to the end plate 134, the plastic circuit member having an electrically conductive radiator plate 139 defining a plurality to apertures 154 in radially extending portions 156 thereof for receiving a like plurality of diodes, the radially extending portions 156 being generally aligned with the arms 138 when the plastic circuit member 137 is secured to the end plate 134 and being separated from one another by airflow means comprising the louvers 158 in the illustrative embodiment, and a plurality of conductor members 140, 142, 144, 146, 148 embedded therein and electrically insulated from one another thereby; inserting diodes 110, 114, 118, 130 having anode electrodes 118A and cathode electrodes 118C into the apertures 154 of the radiator plate 139 with like electrodes (anode electrodes illustrated) extending from the radiator plate 139 and being received by the conductor members 140, 142, 144, 146; and coupling the plastic circuit member 137 to the end plate 134 such that like electrodes (cathode electrodes) of the diodes 112, 116, 120, 128 inserted into the apertures 136 of the end plate 134 are received by the conductor members 140, 142, 144, 146.

The step of forming the generally crescent-shaped plastic circuit member 137 comprises the steps of: supporting the electrically conductive radiator plate 139 in a plastic mold (not shown); supporting the plurality of conductor members 140, 142, 144, 146, 148 in the plastic mold; and inserting plastic into the plastic mold. Preferably, the step of forming the generally crescent-shaped plastic circuit member 137 comprises the steps of: supporting the electrically conductive radiator plate 139 in a plastic mold (not shown); providing the plurality of conductor members 140, 142, 144, 146, 148 as an integral unit 150 wherein the plurality of conductor members 140, 142, 144, 146, 148 are interconnected by severable bridges 152; supporting the integral unit 150 in the plastic mold; inserting plastic into the plastic mold; removing the contents of the plastic mold; and severing the bridges 152. The bridges 152 are severed, for example, by rams inserted through openings (not shown) formed in the plastic of the plastic circuit member 137.

The resulting compact packaging of the diodes 110, 112 of the bridge circuit 100 of the present invention is shown in FIG. 4. All of the electrical connections of the diode electrodes and the conductor members 140, 142, 144, 146, 148 is preferably performed by a single pass through a solder bath. In addition to insulating the radiator plate 139 and the conductor members 140, 142, 144, 146, 148 from one another, the plastic of the plastic circuit member 137 ensures that cooling air is forced through the louvers 158. The plastic also provides a convenient socket 160A for receiving an electrical connector which mates with the terminals 160.

Having thus described the alternator rectifier bridge and method of assembly of the present invention in detail and by reference to preferred embodiments thereof, it will be apparent that modifications and variations are possible without departing from the scope of the invention defined in the appended claims.

What is claimed is:

1. A poly-phase alternator rectifier bridge assembly comprising:

a plurality of positive diodes, each positive diode having an anode electrode and a cathode electrode;

a plurality of negative diodes, each negative diode having an anode electrode and a cathode electrode;

a generally crescent-shaped positive radiator plate having a plurality of apertures formed to receive the cathode electrodes of said positive diodes with the anode electrodes extending beyond said positive radiator plate, said apertures being formed on radially extending portions of said positive radiator plate which radially extending portions include passage means for passing cathode electrodes of said negative diodes to extend beyond said positive radiator plate in the same direction as said anode electrodes of said positive diodes, are separated from one another by airflow means for passing cooling air through said positive radiator plate and serve to pair individual ones of said positive diodes with individual ones of said negative diodes for connection to stator windings of an alternator;

housing means for enclosing one end of said alternator and including apertures formed to receive the anode electrodes of said negative diodes with the cathode electrodes of said negative diodes extending outwardly therefrom, said housing means being formed to receive said positive radiator plate such that said extending cathode electrodes of said negative diodes extend into said passage means; and first electrical circuit means for interconnecting said extending anode/cathode electrodes of said pairs of diodes to said stator windings of said alternator, said positive radiator plate and said first electrical circuit means being embedded into a molded plastic insulator to electrically insulate them from one another and from said housing means.

2. A poly-phase alternator rectifier bridge assembly as claimed in claim 1 wherein said airflow means comprises louvers formed into said positive radiator plate between said radially extending portions thereof.

3. A poly-phase alternator rectifier bridge assembly incorporated into an alternator housing end plate and comprising:

an even plurality of diodes each having an anode electrode and a cathode electrode, said diodes being arranged in diode pairs wherein the anode electrode of one diode of the pair is connected to the cathode electrode of the other diode of the pair and to a stator winding of an alternator;

a plurality of apertures formed into radially extending arms of said alternator housing end plate for receiving a first half of said diodes;

a plastic circuit member adapted to be secured to said end plate, said plastic circuit member having a generally crescent-shaped radiator plate and a plurality of conductor members embedded therein and electrically insulated from one another thereby;

said radiator plate having apertures formed in radially extending portions thereof for receiving a second half of said diodes, said radially extending portions being aligned with said arms and being separated from one another by airflow means for passing cooling air through said positive radiator plate; and said conductor members connecting anode/cathode electrodes of said pairs of diodes to stator windings of said alternator after securing said plastic circuit member to said alternator housing end plate, said radiator plate defining a first output of said alternator and said alternator housing end plate defining a second output of said alternator.

4. A poly-phase alternator rectifier bridge assembly incorporated into an alternator housing end plate as claimed in claim 3 wherein said airflow means comprises louvers formed into said positive radiator plate between said radially extending portions thereof.

5. A poly-phase alternator rectifier bridge assembly incorporated into an alternator housing end plate as claimed in claim 3 wherein said radiator plate defines terminal means for connection to said first output of said alternator.

6. A poly-phase alternator rectifier bridge assembly incorporated into an alternator housing end plate as claimed in claim 5 wherein at least one of said plurality of conductor members defines terminal means for connection thereto.

7. A poly-phase alternator rectifier bridge assembly incorporated into an alternator housing end plate as claimed in claim 5 wherein said terminal means comprises at least one spade terminal.

8. A poly-phase alternator rectifier bridge assembly incorporated into an alternator housing and comprising:

an alternator housing end plate having a plurality of apertures formed into radially extending arms thereof;

a plurality of diodes inserted into said apertures of said end plate;

a plastic circuit member having a generally crescent-shaped radiator plate and a plurality of conductor members embedded therein and electrically insulated from one another thereby;

said radiator plate having apertures formed in radially extending portions thereof, said radially extending portions being aligned with said arms and being separated from one another by airflow means for passing cooling air through said radiator plate;

a plurality of diodes inserted into said apertures of said radiator plate;

means for securing said plastic circuit member to said alternator housing end plate; and said conductor members connecting anode/cathode electrodes of pairs of diodes associated with said arms to stator windings of said alternator after securing said plastic circuit member to said alternator housing end plate, said radiator plate defining a first output of said alternator and said alternator housing end plate defining a second output of said alternator 9. A poly-phase alternator rectifier bridge assembly incorporated into an alternator housing as claimed in claim 8 wherein said airflow means comprises louvers formed into said positive radiator plate between said radially extending portions thereof.

10. A poly-phase alternator rectifier bridge assembly incorporated into an alternator housing as claimed in claim 8 wherein said means for securing said plastic circuit member to said alternator housing end plate comprises plastic extensions of said plastic circuit member.

11. A poly-phase alternator rectifier bridge assembly incorporated into an alternator housing as claimed in claim 8 wherein said radiator plate defines terminal means for connection to said first output of said alternator.

12. A poly-phase alternator rectifier bridge assembly incorporated into an alternator housing as claimed in claim 11 wherein said terminal means comprises at least one spade terminal.

13. A poly-phase alternator rectifier bridge assembly incorporated into an alternator housing as claimed in claim 11 wherein at least one of said plurality of conductor members defines terminal means for connection thereto.

14. A rectifier bridge assembly for a poly-phase alternator having a plurality of stator windings, said bridge assembly comprising:

an alternator housing end plate having radially extending arms including a plurality of apertures formed into said arms for receiving a like plurality of diodes;

a generally crescent-shaped plastic circuit member formed to be received by and secured to said end plate, said plastic circuit member having an electrically conductive radiator plate and a plurality of conductor members embedded therein and electrically insulated from one another thereby;

said radiator plate having a plurality of apertures formed in radially extending portions thereof for receiving a like plurality of diodes, said radially extending portions being aligned with said arms when said plastic circuit member is secured to said end plate and being separated from one another by airflow means for passing cooling air through said radiator plate;

a plurality of diodes each having a first electrode and an opposite second electrode, said apertures of said alternator end plate all receiving like electrodes and said apertures of said radiator plate all receiving like opposite electrodes;

means for securing said plastic circuit member to said alternator housing end plate; and said conductor members connecting first/second electrodes of pairs of diodes associated with said arms to stator windings of said alternator after securing said plastic circuit member to said alternator housing end plate, said radiator plate defining a first output of said alternator and said alternator housing end plate defining a second output of said alternator.

15. A rectifier bridge assembly for a poly-phase alternator having a plurality of stator windings as claimed in claim 14 wherein said airflow means comprises louvers formed into said positive radiator plate between said radially extending portions thereof.

16. A rectifier bridge assembly for a poly-phase alternator having a plurality of stator windings as claimed in claim 14 wherein said means for securing said plastic circuit member to said alternator housing end plate comprises plastic extensions of said plastic circuit member 17. A rectifier bridge assembly for a poly-phase alternator having a plurality of stator windings as claimed in claim 14 wherein said radiator plate defines terminal means for connection to said first output of said alternator.

18. A rectifier bridge assembly for a poly-phase alternator having a plurality of stator windings as claimed in claim 17 wherein said terminal means comprises at least one spade terminal.

19. A rectifier bridge assembly for a poly-phase alternator having a plurality of stator windings as claimed in claim 17 wherein at least one of said plurality of conductor members defines terminal means for connection thereto.

* * * * *